United States Patent
Lee et al.

(10) Patent No.: US 10,038,413 B2
(45) Date of Patent: Jul. 31, 2018

(54) FULLY DEPLETED SILICON ON INSULATOR POWER AMPLIFIER

(71) Applicant: GLOBALFOUNDRIES INC., Grand Cayman (KY)

(72) Inventors: See Taur Lee, Allen, TX (US); Abdellatif Bellaouar, Richardson, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/377,580

(22) Filed: Dec. 13, 2016

(65) Prior Publication Data

US 2018/0167038 A1   Jun. 14, 2018

(51) Int. Cl.
*H03F 1/34* (2006.01)
*H03F 1/52* (2006.01)
*H03F 1/22* (2006.01)
*H03F 3/195* (2006.01)
*H03F 3/213* (2006.01)
(Continued)

(52) U.S. Cl.
CPC ............ *H03F 1/523* (2013.01); *H03F 1/223* (2013.01); *H03F 3/195* (2013.01); *H03F 3/213* (2013.01); *H03F 3/45179* (2013.01); *H03F 1/22* (2013.01); *H03F 1/307* (2013.01); *H03F 3/3022* (2013.01); *H03F 3/45* (2013.01); *H03F 3/45071* (2013.01); *H03F 3/45183* (2013.01); *H03F 2200/171* (2013.01); *H03F 2200/451* (2013.01); *H03F 2203/45154* (2013.01);
(Continued)

(58) Field of Classification Search
CPC .... H03F 3/45; H03F 3/45179; H03F 3/45183; H03F 3/45188; H03F 1/307; H03F 3/30; H03F 3/3001; H03F 1/34; H03F 3/3022; H03F 3/45071; H03F 1/523; H03F 1/223; H03F 3/195; H03F 3/213
USPC ......................................... 330/253, 255, 260
See application file for complete search history.

(56) References Cited

U.S. PATENT DOCUMENTS

| 5,210,505 A * | 5/1993 | Eddlemon | H03F 3/45076 330/253 |
| 6,498,533 B1 * | 12/2002 | Sowlati | H03F 1/223 330/251 |

(Continued)

OTHER PUBLICATIONS

Winoto et al., "A WLAN and Bluetooth Combo Transceiver with Integrated WLAN Power Amplifier, Transmit-Receive Switch and WLAN/Bluetooth Shared Low Noise Amplifier", IEE, 2012, 4 pages.

*Primary Examiner* — Khanh V Nguyen
(74) *Attorney, Agent, or Firm* — David Cain; Andrew M. Calderon; Roberts Mlotkowski Safran Cole & Calderon, P.C.

(57) ABSTRACT

The present disclosure generally relates to semiconductor structures and, more particularly, to a fully depleted silicon on insulator power amplifier with unique biases and voltage standing wave ratio protection and methods of manufacture. The structure includes a pseudo-differential common source amplifier; first stage cascode devices connected to the pseudo-differential common source amplifier and protecting the pseudo-differential common source amplifier from an over stress; second stage cascode devices connected to the first stage cascode devices and providing differential outputs; and at least one loop receiving the differential outputs from the second stage cascode devices and feeding back the differential outputs to the second stage cascode devices.

20 Claims, 9 Drawing Sheets

(51) Int. Cl.
*H03F 3/45* (2006.01)
*H03F 3/30* (2006.01)
*H03F 1/30* (2006.01)

(52) U.S. Cl.
CPC .............. *H03F 2203/45202* (2013.01); *H03F 2203/45228* (2013.01); *H03F 2203/45462* (2013.01)

(56) References Cited

U.S. PATENT DOCUMENTS

| | | | |
|---|---|---|---|
| 6,515,547 B2 * | 2/2003 | Sowlati | H03F 1/223 330/277 |
| 7,215,206 B2 | 5/2007 | Dupuis et al. | |
| 7,522,671 B2 * | 4/2009 | Kiamilev | H04L 25/0274 375/257 |
| 7,541,875 B2 * | 6/2009 | Taylor | H03F 1/223 330/133 |
| 7,551,036 B2 * | 6/2009 | Berroth | H03F 1/0277 330/310 |
| 7,633,344 B2 * | 12/2009 | Yamaguchi | H03F 1/14 330/188 |
| 8,098,099 B2 * | 1/2012 | Kao | H03F 1/42 330/260 |
| 8,368,469 B2 * | 2/2013 | Mohammadi | H03F 3/426 330/277 |
| 8,618,879 B2 * | 12/2013 | Mizokami | H03F 1/0266 330/124 R |
| 9,214,898 B2 * | 12/2015 | Ran | H03F 3/45179 |
| 9,425,835 B2 * | 8/2016 | Seckin | H04B 1/0475 |

* cited by examiner

FULLY DEPLETED SILICON ON INSULATOR POWER AMPLIFIER

FIELD OF THE INVENTION

The present disclosure generally relates to semiconductor structures and, more particularly, to a fully depleted silicon on insulator power amplifier with unique biases and voltage standing wave ratio protection and methods of manufacture.

BACKGROUND

An integrated power amplifier is desirable in wireless devices. For example, the integrated power amplifier can reduce the form factor, costs, test time and components on board. Additionally, the integrated power amplifier enables more sophisticated linearization and calibration techniques to achieve better efficiency and performance.

Many power amplifiers are standalone components. Further, integrated power amplifiers can have a relatively poor efficiency due to high parasitic losses. Additionally, due to a low gain device being available, integrated power amplifiers have more than one gain stage and consequently can require inter-stage matching, and hence a higher silicon area.

SUMMARY

In an aspect of the disclosure a structure comprises: a pseudo-differential common source amplifier; first stage cascode devices connected to the pseudo-differential common source amplifier and protecting the pseudo-differential common source amplifier from an over stress; second stage cascode devices connected to the first stage cascode devices and providing differential outputs; and at least one loop receiving the differential outputs from the second stage cascode devices and feeding back the differential outputs to the second stage cascode devices.

In an aspect of the disclosure a structure comprises: a core device emitting an output and comprising: cascode devices providing differential outputs; and at least one loop feeding back the differential outputs to the cascode devices; a transformer providing an RF signal to the core device; and a notch filter connected to the transformer and positioned at second harmonics of the RF signal.

In an aspect of the disclosure a method comprises: protecting a pseudo-differential common source amplifier from an over stress through first stage cascode devices connected to the pseudo-differential common source amplifier; providing differential outputs from second stage cascode devices connected to the first stage cascode devices to a loop; and feeding back the differential outputs from the loop to the second stage cascode devices.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
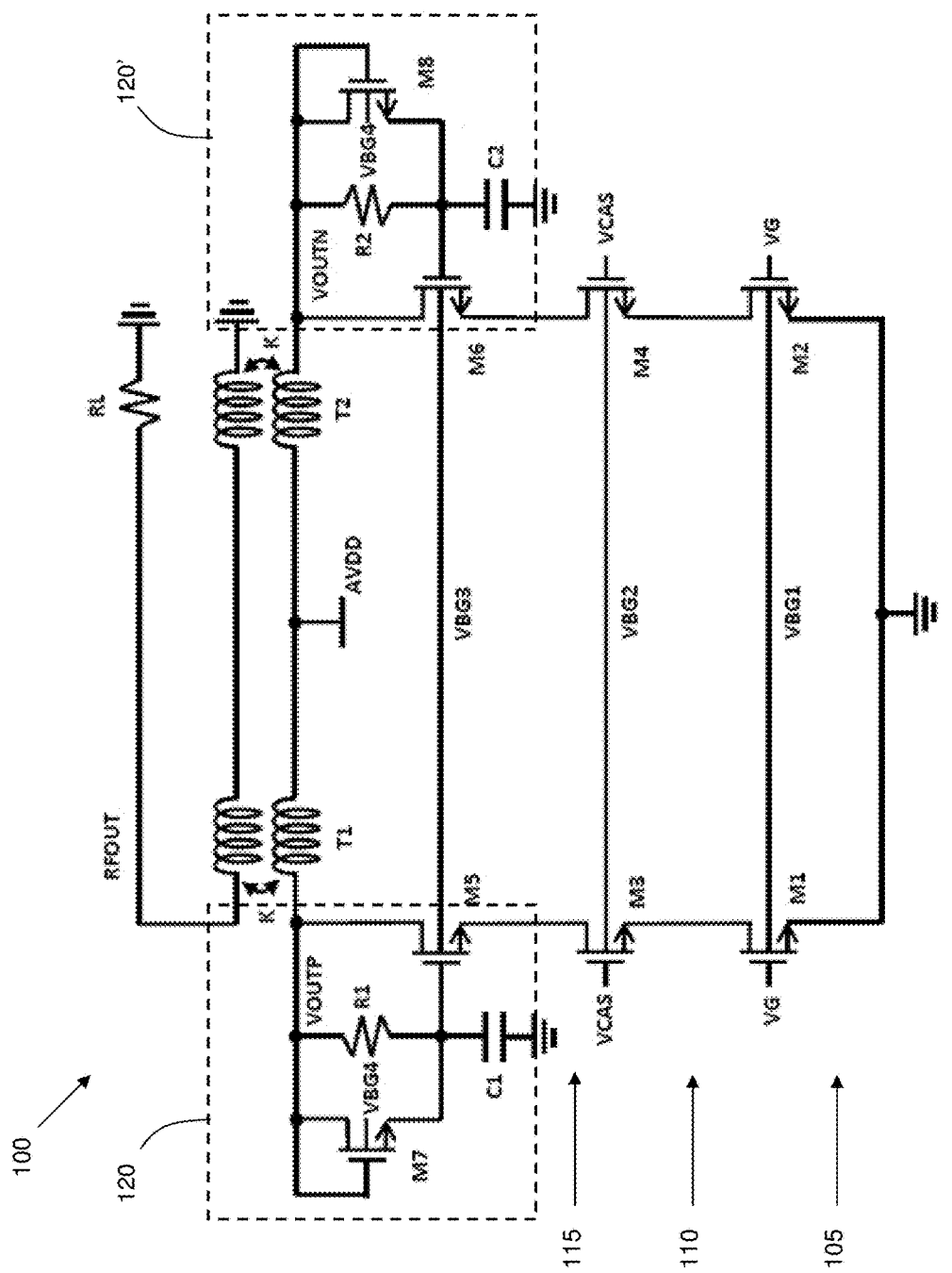
FIG. 1 shows a circuit diagram of a core device with unique back gate biases in accordance with aspects of the present disclosure.

The present disclosure generally relates to semiconductor structures and, more particularly, to a fully depleted silicon on insulator (FDSOI) power amplifier with unique biases and voltage standing wave ratio protection and methods of manufacture. In embodiments, the structures and methods described herein provide for a fully integrated power amplifier (PA) in a FDSOI process without using high voltage devices. Instead, the PA can use the core device and a 1.8V device. This is accomplished by unique biases that achieve a high voltage swing without using a high voltage device. It is contemplated that the structures and methods disclosed herein can be used for other processes in addition to the FDSOI process.

The structures and methods disclosed herein provide many advantages. For example, advantages include a relatively high potential for 22 nm FDSOI and similar processes technology promotion due to the structures and methods allowing for a relatively high performance fully integrated power amplifier in almost any RF product. Further advantages include, amongst others:

1) a highly efficient fully integrated power amplifier in an FDSOI process without using a high voltage device;
2) a single stage high gain power amplifier;
3) a programmable notch filter at an input of the power amplifier for minimizing EVM and extending the output power;
4) a programmable capacitor that can achieve a high-Q and high tuning ratio simultaneously through the back-gate bias; and
5) providing high output power and low EVM due to lower parasitic loss and less non-linear capacitances.

In embodiments, the structures and methods described herein fully utilize the benefits of the FDSOI process, e.g., high ft/fmax devices and very low drain/source capacitances, among other benefits. To obtain the best power-added efficiency (PAE), a single stage power amplifier is more desirable compared to a multiple stage power amplifier. In embodiments, a high gain power amplifier is realized in a single stage.

In embodiments, symmetrical transformer structures and methods are provided to connect a center tap of a transformer. In embodiments, the center tap is connected downward with respect to the transformer and runs perpendicular to the transformer to the outside world. By having the center tap connected in this way, a very symmetrical transformer is provided. In more specific embodiments, the center tap connection and a capacitor are used to form a notch filter for improving the error vector magnitude (EVM). The notch filter is connected to the transformer, with an inductor of the notch filter connected to the center tap, allowing for the notch filter to be placed at the second harmonics of an RF signal provided by the transformer. In even further embodiments, the center frequency of the notch filter can be made programmable.

In specific embodiments, a core device structure for a single stage pseudo-differential FDSOI power amplifier is provided. The structure includes pseudo-differential common source amplifiers, followed by first stage cascode devices and second stage cascode devices. In embodiments, both the first and second stage cascode devices are realized using 1.8V devices. The first stage cascode devices can protect the pseudo-differential common source amplifiers from over stress by adjusting the gate voltage of the transistors of the first stage cascode devices through a cascode voltage (VCAS). More specifically, the first stage cascode devices provide protection by changing a bias from the VCAS voltage. In embodiments, differential outputs from the transistors of the second stage cascode devices are connected to transformers. It is preferable for these transformers to be 1:2, e.g., 1 turn primary and 2 turns secondary, to convert the differential outputs of the second stage cascode devices into a single-ended output. More specifically, a 1:2 transformer can be used to convert the differential outputs into a single-ended output. The single-ended output then drives the 50 ohm load.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

FIG. 1 shows a circuit diagram of a core device structure and respective fabrication processes in accordance with aspects of the present disclosure. Specifically, the core device structure 100 allows for an efficient FDSOI power amplifier with unique biases and VSWR protection for use in radio-frequency (RF) devices. For example, the core device structure 100 allows for a fully integrated power amplifier in an FDSOI process without using a high voltage device. The core device structure 100 includes a pseudo-differential common source amplifier 105, which is illustrated as transistors M1 and M2 in FIG. 1. The inputs of the pseudo-differential common source amplifier 105 are labeled VG, which include a dc voltage and an RF signal.

Figure 3:
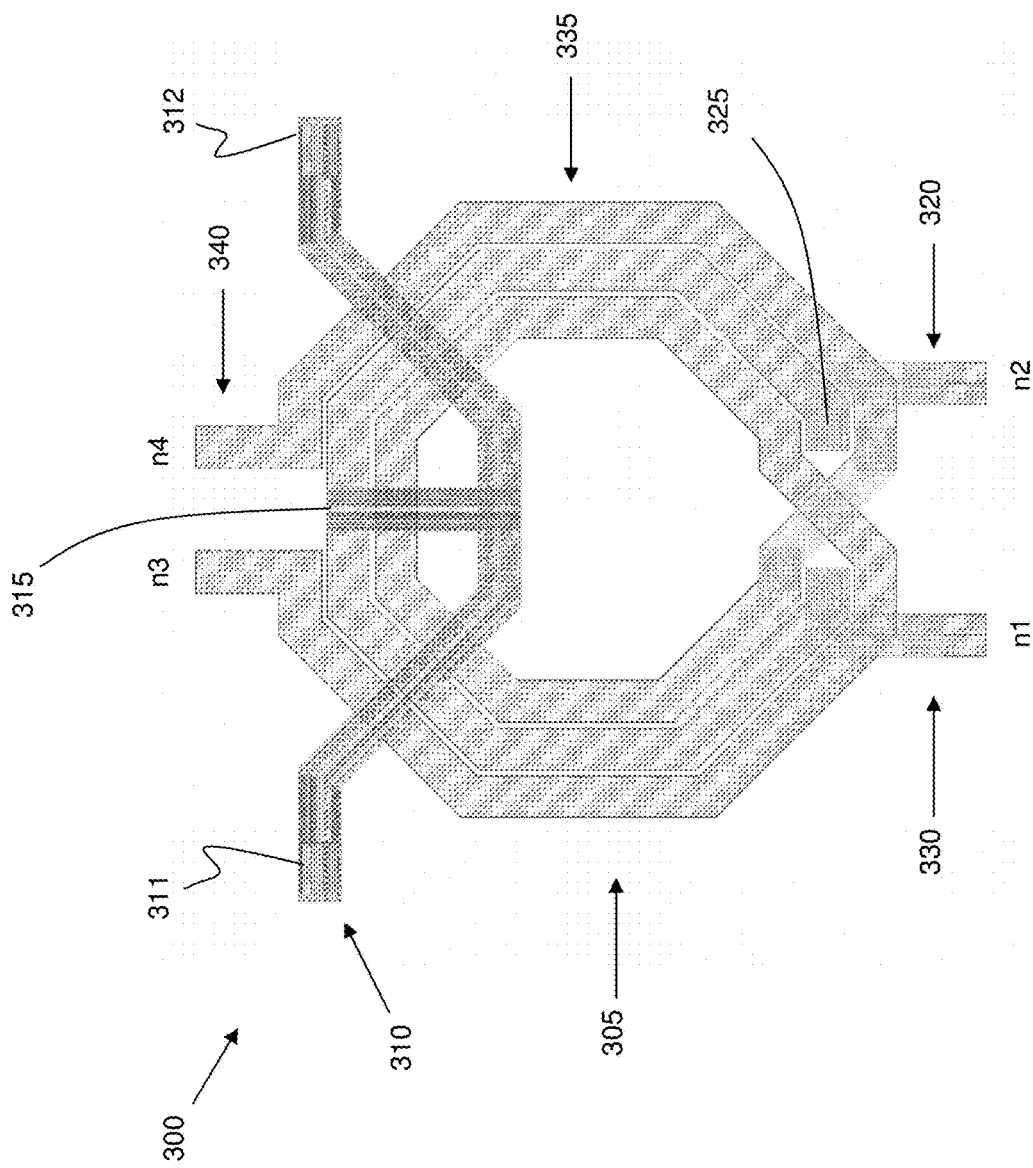
FIG. 3 shows a layout of a transformer with a center tap connected downward and running perpendicular with respect to the transformer in accordance with aspects of the present disclosure.

In order to provide the dc voltage and RF signal simultaneously, an input transformer, such as transformer 300 shown in FIG. 3, can be used. In embodiments, the input transformer provides a way to send an RF signal into the pseudo-differential common source amplifiers M1 and M2 of the pseudo-differential common source amplifier 105, and at the same time the input transformer provides a dc bias. With the advances in modulation techniques and higher complexity signals, a frequency-division multiplexing (FDM) scheme can be used, e.g., an orthogonal frequency division multiplexing (OFDM) modulation technique. Due to its high bandwidth nature, this bias should provide high impedance to the RF signal and low impedance to the baseband signal.

Still referring to FIG. 1, the core device structure 100 further includes first stage cascode devices 110 and second stage cascode devices 115. The first stage cascode devices 110 are illustrated as transistors M3 and M4, while the second stage cascode devices 115 are illustrated as transistors M5 and M6. The first stage cascode devices 110 and second stage cascode devices 115 can be both realized using 1.8V devices.

The first stage cascode devices 110 are configured to protect the pseudo-differential common source amplifier 105 from over stress, such as from voltage standing wave ratio (VSWR). The protection offered by the first stage cascode devices 110 occurs by adjusting a gate voltage of the transistor M3 and M4 through a cascode voltage (VCAS), which is further discussed with respect to FIGS. 7 and 8.

The outputs from the transistors M5 and M6 of the second stage cascode devices 115 are connected to a transformer. For example, the output of the transistor M5 is connected to the transformer T1, while the output of the transistor M6 is connected to the transformer T2. The transformers T1 and T2 are preferably 1:2, e.g., 1 turn primary and 2 turns secondary, to convert the differential outputs from the transistors M5 and M6 into a single-ended output. The single-ended output then drives a 50 ohm load labeled RL. The center tap of the primary windings of the transformers T1 and T2 are connected to AVDD, which can be any suitable voltage, e.g., 2.7 V.

The core device structure 100 further includes feedback loops 120 and 120'. In embodiments, the feedback loop 120 receives and feeds to the transistor M5, while the feedback loop 120' receives and feeds to the transistor M6. More specifically, the differential outputs VOUTP/VOUTN received by the feedback loops 120 and 120' are feed back to the gates of M5 and M6 through resistors R1 and R2 in order to achieve a high voltage swing to deliver a high output power. Feeding back the differential output signals VOUTP/VOUTN back to the gates of the transistors M5 and M6 indicates that both gates of the transistors M5 and M6 "followed" the differential outputs. Following the differential outputs of the transistors M5 and M6 of the second stage cascode devices 115 reduces a drain to gate over stress problem.

In addition to the resistors R1 and R2, the feedback loops 120 and 120' include capacitors C1 and C2. Preferably, the capacitors C1 and C2 are connected in the feedback loops 120 and 120' as shown in FIG. 1 to act as a low pass filter together with the resistors R1 and R2, respectively. The corners, e.g., the corner frequency or the cutoff frequency, of the low pass filters formed by capacitors C1 and C2 can be set to more than about three times the highest modulation bandwidth. Further, the corners of the low pass filters can be programmable if the power amplifier is required to support a different modulation bandwidth by changing the capacitances of capacitor C1 and C2.

The feedback loops 120 and 120' further include two additional diode-connected transistors M7 and M8 to boost the signals at the gates of M5 and M6 when the output signals are higher than the threshold voltage of M7 and M8 in the positive direction. For transistors M7 and M8, the back gate bias voltage, shown as VBG4, can be used to control the amount of feedback given to the transistors M5 and M6 of the second stage cascode devices 115.

By having the FDSOI process, the drain or source capacitances are low, allowing the use of reasonable transistor sizes to deliver the required output power. This improves the power added efficiency (PAE) of the power amplifier. Also, the FDSOI process provides another flexibility by access to its back-gate, which can be used to adjust a desired threshold voltage back to its nominal value due to a process shift, for example.

FIG. 1 further illustrates the back gate bias voltages as VBG1 for the transistors M1 and M2 of the pseudo-differential common source amplifier 105; VBG2 for the transistors M3 and M4 of the first stage cascode devices 110; VBG3 for the transistors M5 and M6 of the second stage cascode devices 115; and VBG4 for the additional transistors M7 and M8 of the feedback loops 120 and 120'. By increasing the back gate voltage to a more positive setting for NMOS devices, the transconductance of the device increases. This allows the flexibility to use smaller devices and thus smaller parasitic capacitances and consequently lower loss, for example.

Figure 2:
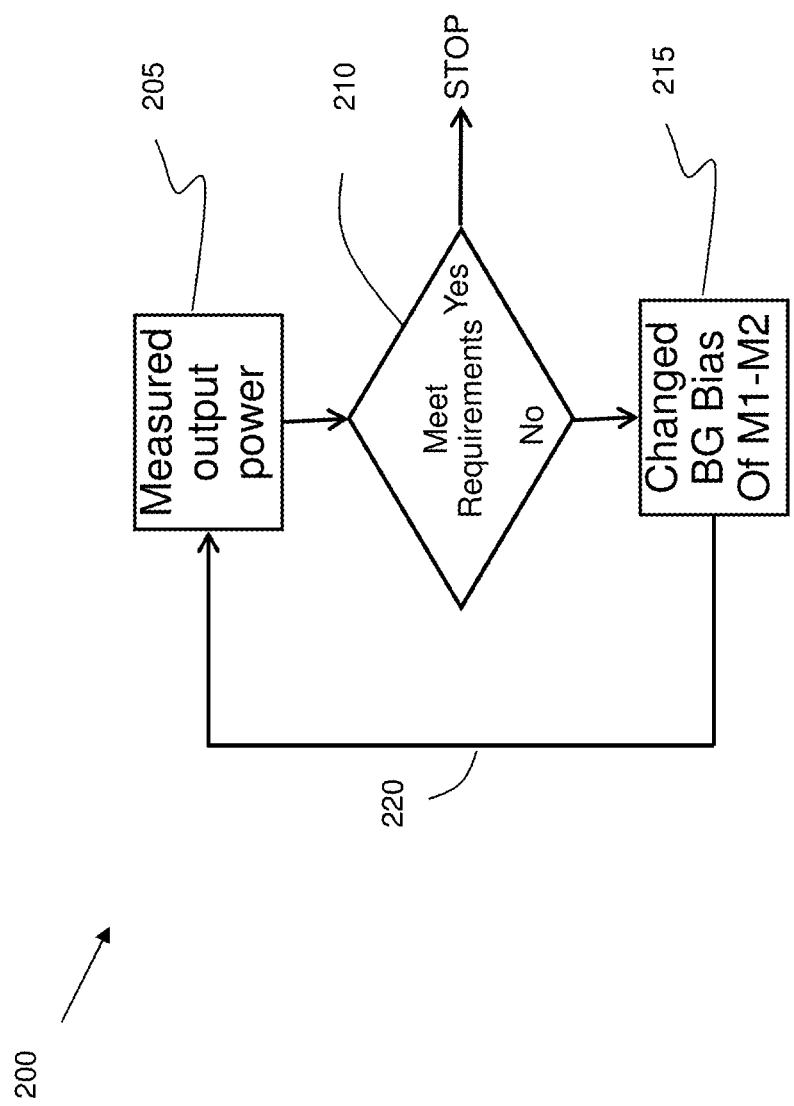
FIG. 2 shows a flow diagram illustrating a back-gate bias calibration for the core device of FIG. 1 in accordance with aspects of the present disclosure.

FIG. 2 illustrates a process 200 for a system level back-gate calibration in view of the core device structure 100. More specifically, the process 200 is for a back-gate bias calibration used to tune the output power of the core device structure 100. At step 205, an output power of the core device structure 100 is measured. At step 210, if the measured output power meets the user's specific requirements, then the process 200 stops. However, if the measured output power does not meet the user's specific requirements, the process 200 moves to step 215. At step 215, the back gate biases of the transistors M1 and M2 of the pseudo-differential common source amplifier 105 are changed. Once the back gate biases of the transistors M1 and M2 are changed, step 220 redirects the process 200 back to original step 205. The process 200 continues to repeat until the specific output power requirements are meet.

FIG. 3 illustrates a symmetrical transformer 300, with symmetrical transformer 300 being a 1:2 transformer, e.g., 1 turn primary and 2 turns secondary transformer. Generally, a center tap is at the top for a transformer 1:2. However, this configuration is not desirable since it can reduce the output power. For this reason, amongst others, the present disclosure provides methods and structures to connect the center tap downward, and then run the center tap perpendicular to the transformer to the outside world.

Specifically, FIG. 3 illustrates the symmetrical transformer 300 with a transformer 305 and a symmetrical center tap 310, where the symmetrical center tap 310 is connected downward and runs perpendicular with respect to the transformer 305 to the outside world. By having the symmetrical center tap 310 connected in this way, it provides a very symmetrical transformer 300. In embodiments, the symmetrical center tap 310 includes inputs na, labeled as 311, input nb, labeled as reference number 312 and input nct, labeled as reference number 315. Inputs na 311 and nb 312 can either be connected together or one of them can be left open. As an example, if na 311 is left open, then the inductance L1 shown in FIGS. 4 and 5 is the inductance from nct 315 to nb 312.

The symmetrical transformer 300 further includes a primary winding 320, bar vias 325, rails 330, terminals 335 and a secondary winding 340. It is contemplated that for the input of the power amplifier, a transformer 2:1 is used, whereas for the output of the power amplifier, transformer 1:2 is used. The inputs n1 and n2 are the inputs to the primary winding 320 and the outputs n3 and n4 are the outputs at the secondary winding 340 of the transformer 1:2 in this illustration.

Figure 4:
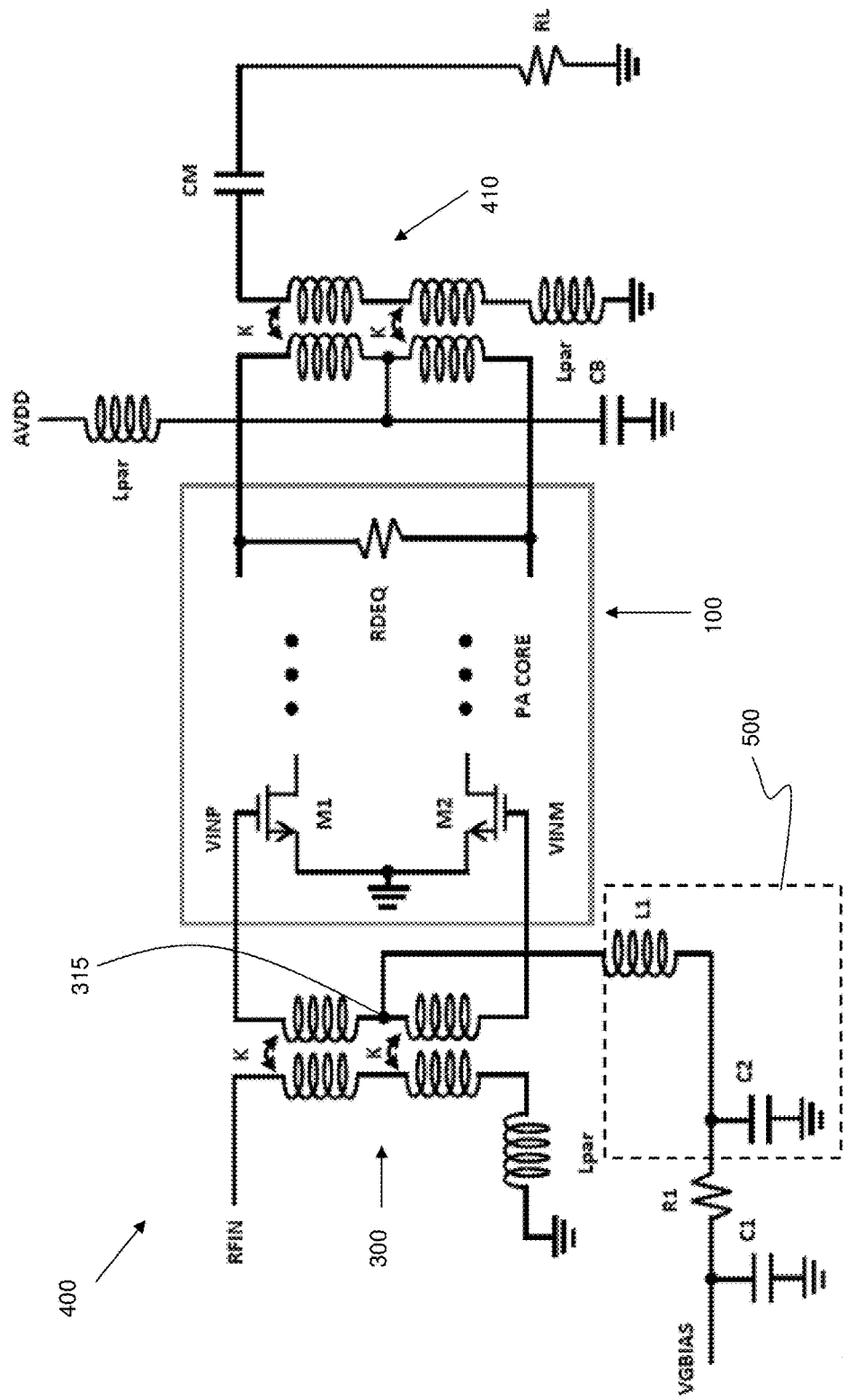
FIG. 4 shows a circuit diagram of a single-ended input and output power amplifier in accordance with aspects of the present disclosure.
Figure 5:
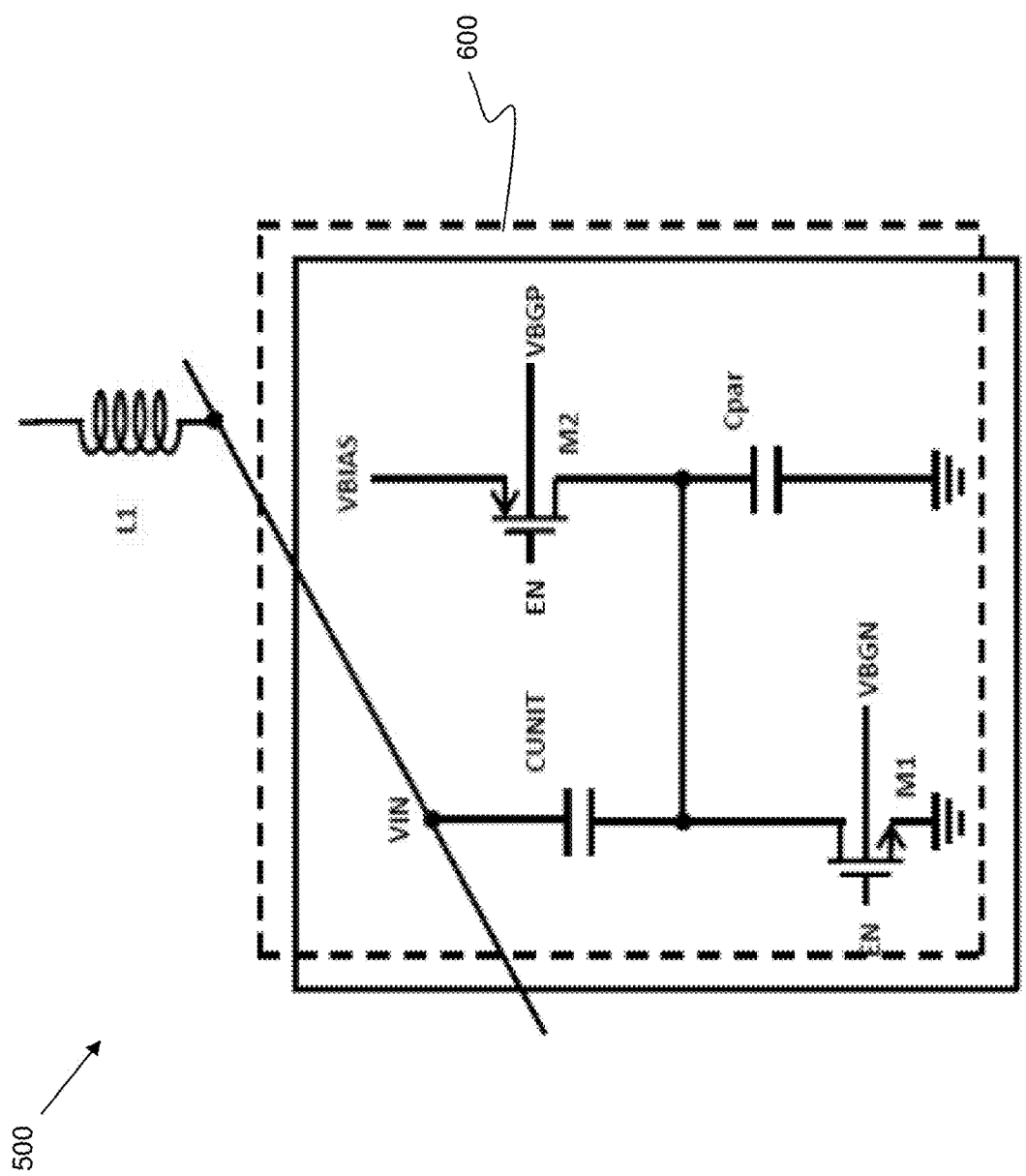
FIG. 5 shows a circuit diagram of a programmable notch filter in accordance with aspects of the present disclosure.

FIG. 4 illustrates a single-ended input and single-ended output power amplifier (SEIN SEOUT PA) 400. The SEIN SEOUT PA 400 includes the transformer 300 of FIG. 3 and the core device 100 of FIG. 1. It is also contemplated that the core device implemented in the SEIN SEOUT PA 400 can be a simplified version of the core device 100 of FIG. 1.

As seen in FIGS. 1 and 4, the inputs of the pseudo-differential common source amplifier 105 of the core device 100 are labeled as VG. These VG inputs consist of a dc voltage and an RF signal. To provide a dc voltage and RF signal simultaneously to the pseudo-differential common source amplifier 105, the transformer 300 can be used. Connecting one of the primary inputs of the transformer 300 to ground and applying a single-ended RF signal at the other end creates SEIN SEOUT PA 400.

The input supplied by transformer 300 provides a way to send a RF signal into the pseudo-differential common source amplifiers M1 and M2 of the pseudo-differential common source amplifier 105 and at the same time also provide a DC bias. Due to its high bandwidth nature, the DC bias should provide a high impedance to the RF signal and a low impedance to a baseband signal. An input transformer with a capacitor-resistor filter, e.g., C1-R1-C2, is the most desirable candidate.

The differential outputs VOUTP/VOUTN of the gates of transistors M5 and M6 of the second stage cascode devices 115 from the core device 100 are connected to the primary input of the transformer 410, which is a transformer 1:2. One end of the secondary winding of the output transformer 410 is connected to ground through Lpar, which is a parasitic inductance from a probe or bondwire, for example. The other end of the output transformer 410 is connected to a capacitor CM before it is connected to the output load RL. Further, capacitor CM acts as a matching component.

To obtain an improved signal S22, e.g., output return loss, a resistor RDEQ is connected, as shown in FIG. 4. A center tap of the primary winding of the output transformer 410 is connected to AVDD and a bypass capacitor CB. The Lpar connecting the center tap of the output transformer 410 to the AVDD is again to model the parasitic inductance from either a probe or bondwire, amongst other examples. A bypass capacitor CB is used to make the center tap of the primary winding of the output transformer 410 as close to a perfect AC ground.

Still referring to FIG. 4, the inductor L1 is shown connected to the center tap 315 of the secondary winding of the transformer 300. Further, the inductor L1 is connected to the capacitor 1-resistor 1-capacitor 2 (C1-R1-C2) filter. The inductor L1 together with C2 forms a notch filter 500. The notch filter 500 is a very important feature in that by placing the notch filter 500 at the second harmonics of the RF signal of the VG input, it can improve the EVM and subsequently can increase the delivered output power.

FIG. 5 shows the notch filter 500 formed by the inductor L1 and the capacitor C2, with a schematic of capacitor C2 represented by the reference number 600. The center frequency of the notch filter 500 can be programmable. Since L1 is fixed, to make the notch filter 500 programmable, a change to the capacitance of capacitor C2 is needed. By connecting a few programmable capacitor units in parallel, and connecting all the VIN together to the center tap inductance L1, a programmable notch filter 500 is formed.

The number of capacitor units required depends on how fine the tuning frequency is and how wide the programmable frequency is needed to cover.

Figure 6:
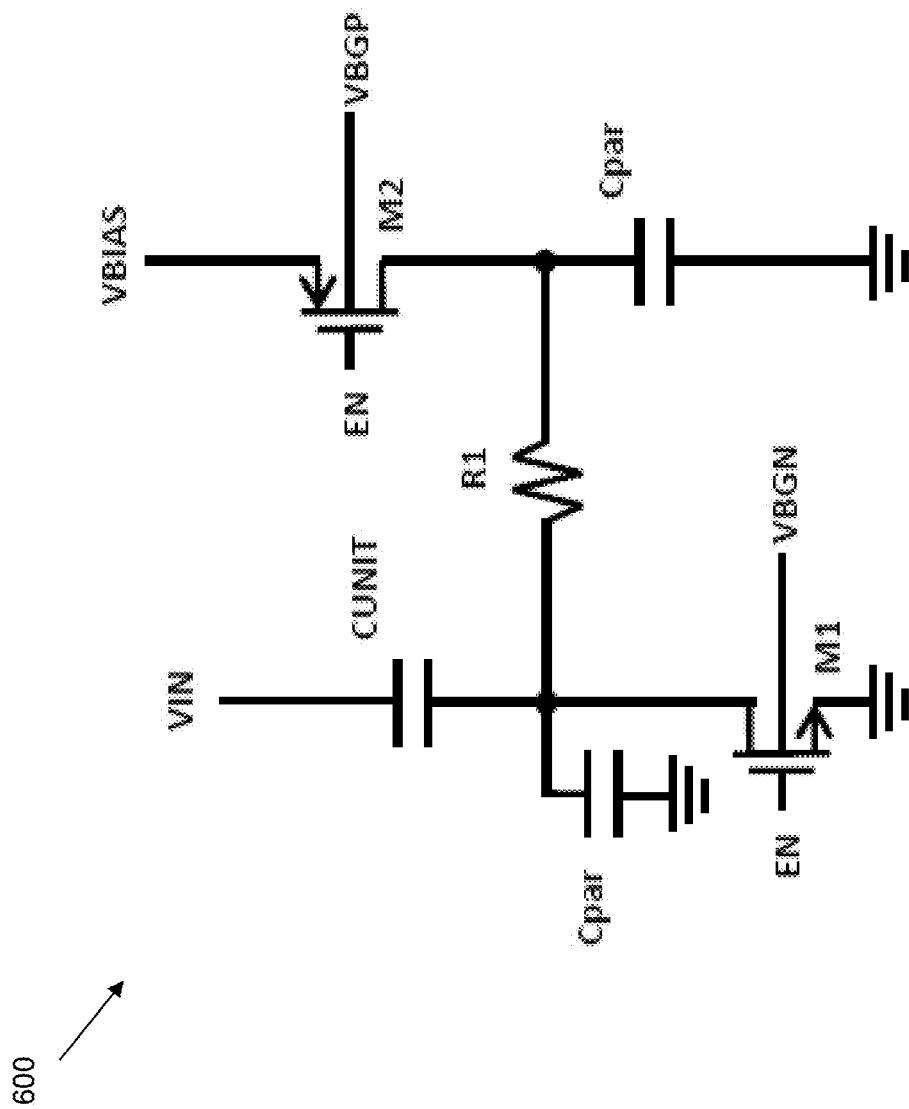
FIG. 6 shows a circuit diagram of a programmable unit capacitor for the notch filter of FIG. 5 in accordance with aspects of the present disclosure.

FIG. 6 shows the schematic 600 of capacitor C2. More specifically, FIG. 6 shows the programmable unit capacitor with switches biased with back gates. CUNIT is the unit capacitor and is connected between VIN and transistor M1, which acts as switch to ground. Another pmos transistor M2 is connecting between the bottom plate of capacitor CUNINT and VBIAS. The M2 transistor of schematic 600 is preferably to be sized with a longer channel length and with a minimum width.

When EN is enabled logic high, transistor M1 of FIG. 6 is on and thus the unit capacitor is connected between VIN and ground. At this stage, transistor M2 of FIG. 6 is off. When the EN is logic low, transistor M1 is off and transistor M2 is on, and since transistor M2 has long channel length and minimum channel width, it has a relatively high resistance between the bottom plate of CUNIT and VBIAS. Transistor M2 of schematic 600 provides a DC voltage to the bottom plate of CUNIT. Without transistor M2, at this moment, the DC voltage of CUNIT is unknown.

Still referring to FIG. 6, capacitor Cpar is the total capacitance from the bottom plate of CUNIT and the parasitic capacitances from the transistors M1 and M2 of schematic 600. To get a large tuning ratio, e.g., Con/Coff, Cpar has to be minimized. Two of the most dominant sources are from transistor M1 and CUNIT. Since M2 uses a minimum width, its contribution is at a minimum. For a given CUNIT, the only parameter that can be manipulated is the width of transistor M1. By having a big width (W), the on resistance, e.g., RON, will be low (RON is inverse proportional to W and (Vgs–Vth)). Thus, it improves the quality (Q) of the capacitor and subsequently has a sharper notch filter.

However, with a large width, the parasitic influence is larger as well, which reduces the tuning range. The other way to lower the RON without using a large width is to maximize (Vgs–Vth). Since Vgs has a limit, in this case limited by a gate oxide breakdown (Vgs is equal to Vdd for example), the only parameter left is to minimize Vth.

Since FDSOI allows access to its back-gate, the back-gate can be forward biased. For example, during EN=1, VBGN is increased so that the Vth of transistor M1 is zero, and the RON would be at a minimum. By doing so, a very high Q capacitor can be attained and at the same time a best tuning ratio. During an off time (EN=0), VBGN can be connected to zero, to minimize any leakage current. The same concept can be used for the pmos back-gate, VBGP.

The purpose of the PMOS transistor M2 of FIG. 6 is to provide a DC bias to the bottom plate of CUNIT during off. Another approach is by having another resistor R1. Under this approach, the resistor R1 can have the minimum width and transistor M2 is acting as a switch only.

The structures and methods described herein use only a core device, such as core device 100, and 1.8V devices. Since the power amplifier is driving an external load directly, for example an antenna, if the load impedance changes, the power amplifier will see a different load. If the load impedance is higher than 50 ohm, for example, this load is transformed back to the primary input of the transformer and thus the power amplifier will see a higher load impedance and consequently higher voltage swing.

Figure 7:
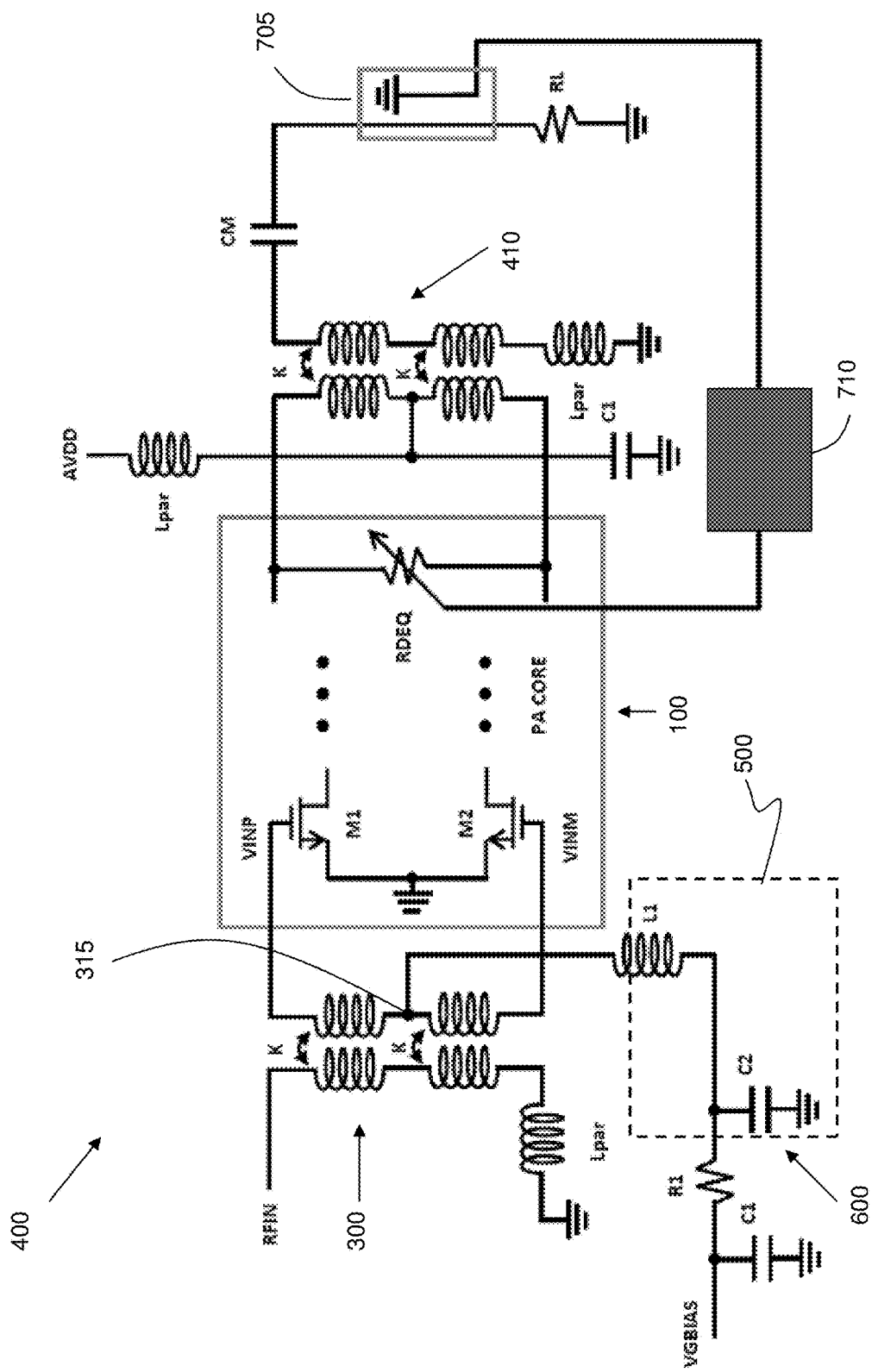
FIG. 7 shows a circuit diagram for mitigating voltage standing wave ratio (VSWR) for the power amplifier of FIG. 4, by implementing a power detector and coupler in accordance with aspects of the present disclosure.

To protect the devices from over stress, a coupler 705 can be used at the output of the SEIN SEOUT PA 400. The coupler 705 senses the output power of the SEIN SEOUT PA 400 through a power detector 710, as shown in FIG. 7. If the power is higher than a certain level, the resistance of RDEQ is reduce and thus the impedance that the power amplifier sees is reduced, and at the same time, the voltage swing is reduces. This mechanism will protect the devices from over stress due to a high voltage standing wave ratio (VSWR).

Figure 8:
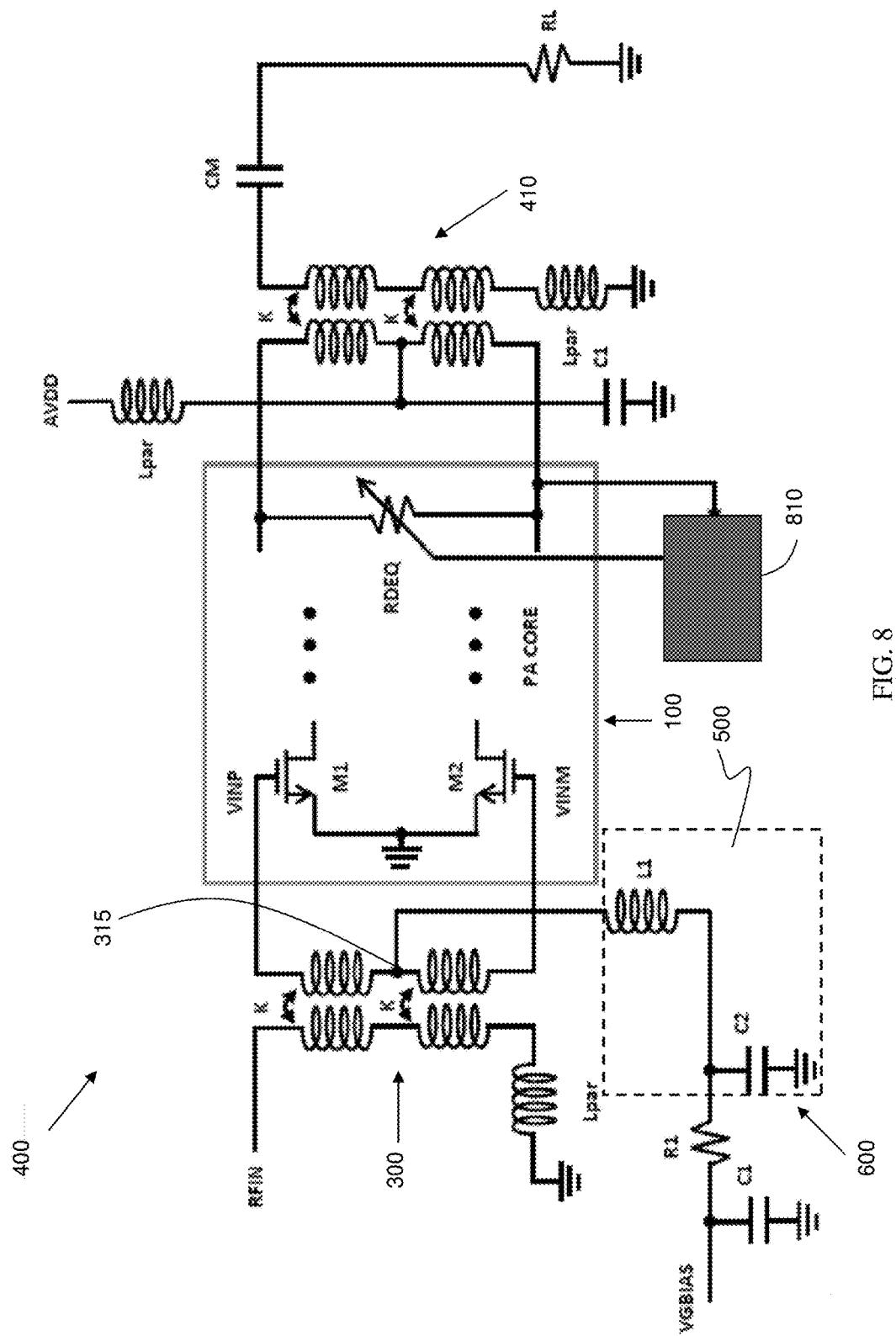
FIG. 8 shows an alternative circuit diagram for mitigating VSWR for the power amplifier of FIG. 4, by implementing a voltage peak detector in accordance with aspects of the present disclosure.

FIG. 8 illustrates alternative structures and methods for detecting output load changes of the SEIN SEOUT PA 400. Specifically, the output voltage swing is sensed through a voltage peak detector 810. The same concept described for FIG. 7 above can be applied with respect to FIG. 8. Again, if the voltage peak detector 810 is higher than a set threshold, the resistance of RDEQ is changed accordingly.

Figure 9:
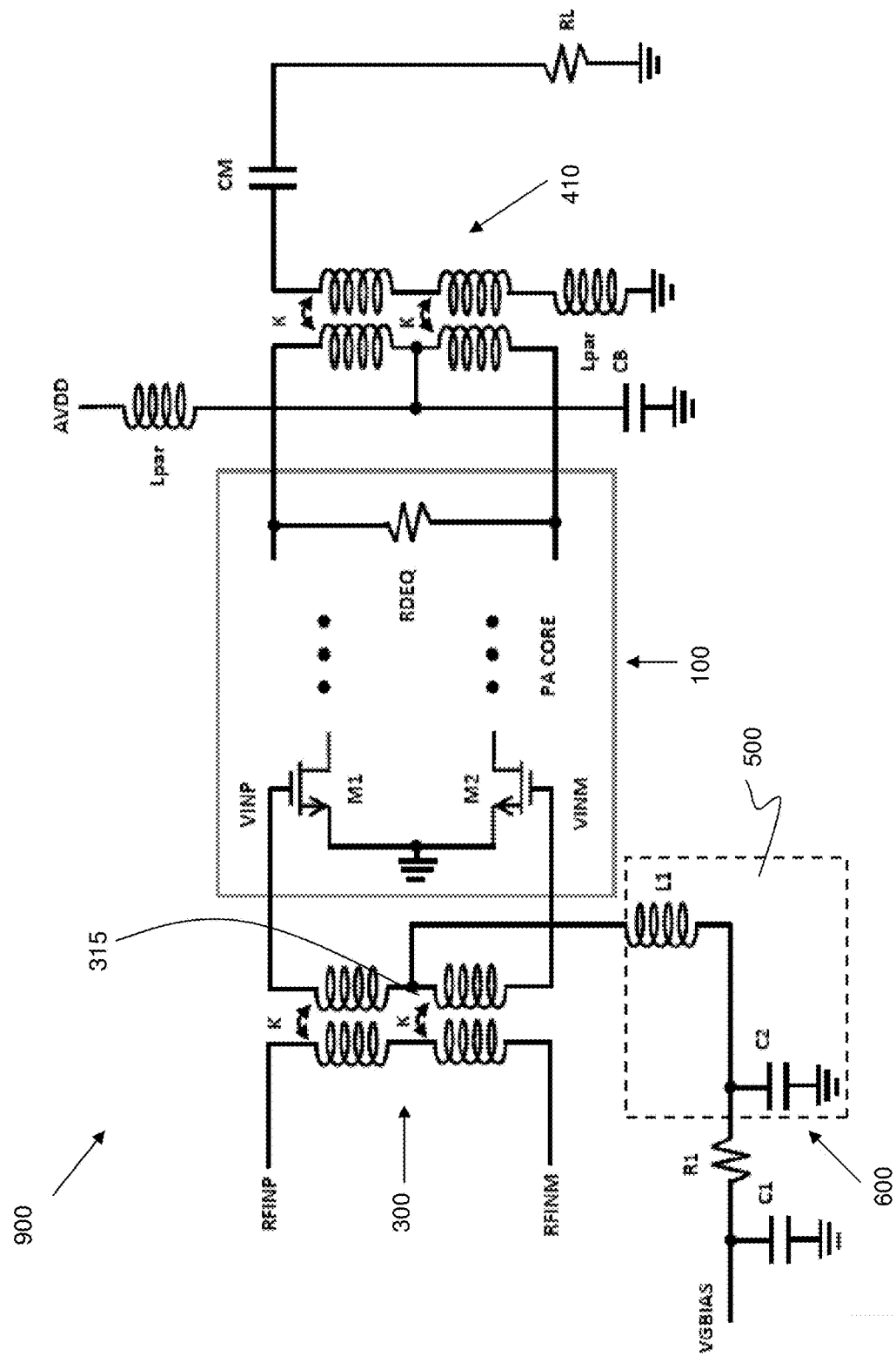
FIG. 9 shows a circuit diagram of a differential input and single-ended output power amplifier in accordance with aspects of the present disclosure.

Although a SEIN SEOUT PA 400 of FIG. 4 was used as a single-ended input power amplifier, this SEIN SEOUT PA 400 is not the only power amplifier contemplated herein. For example, FIG. 9 illustrates a differential input single-ended output power amplifier (DIFFIN SEOUT PA) 900. For DIFFIN SEOUT PA 900, RFINP and RFINN are the differential inputs.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a pseudo-differential common source amplifier;
first stage cascode devices connected to the pseudo-differential common source amplifier and protecting the pseudo-differential common source amplifier from an over stress;
second stage cascode devices connected to the first stage cascode devices and providing differential outputs; and
at least one loop receiving the differential outputs from the second stage cascode devices and feeding back the differential outputs to the second stage cascode devices, wherein
the second stage cascode devices comprise a plurality of transistors and the at least one loop feeding back the differential outputs to the plurality of transistors,
gates of the plurality of transistors connect the differential outputs for reducing a drain to gate over stress, and the at least one loop comprises a diode-connected transistor for boosting signals at the gates of the transistors.

2. The structure of claim 1, wherein the at least one loop includes a low pass filter.

3. The structure of claim 2, wherein the low pass filter has a corner frequency set to more than about three times a highest modulation bandwidth.

4. The structure of claim 3, wherein the low pass filter comprises at least one capacitor and the corner frequency is programmable by changing the capacitance of the at least one capacitor.

5. The structure of claim 1, wherein the first stage cascode devices and the second stage cascode devices are 1.8 V devices.

6. The structure of claim 1, wherein the first stage cascode devices protect the pseudo-differential common source amplifier from over stress by adjusting a gate voltage of transistors of the first stage cascode devices through a cascode voltage.

7. The structure of claim 1, wherein the differential outputs of the second stage cascode devices are connected to a transformer.

8. The structure of claim 7, wherein the transformer is 1 turn primary and 2 turns secondary, which converts the differential outputs into a single-ended output.

9. The structure of claim 8, wherein the single-ended output drives a load.

10. The structure of claim 1, wherein the pseudo-differential common source amplifier is inputted simultaneously with a dc voltage and RF signal.

11. A structure comprising:
- a core device emitting an output and comprising:
  - cascode devices providing differential outputs; and
  - at least one loop feeding back the differential outputs to the cascode devices;
- a transformer providing an RF signal to the core device; and
- a notch filter connected to the transformer and positioned at second harmonics of the RF signal, wherein
- the cascode devices comprise a plurality of transistors and the at least one loop feeding back the differential outputs to the plurality of transistors,
- gates of the plurality of transistors connect the differential outputs for reducing a drain to gate over stress, and
- the at least one loop comprises a diode-connected transistor for boosting signals at the gates of the transistors.

12. The structure of claim 11, wherein the transformer comprises a downward connected center tap running perpendicular to the transformer.

13. The structure of claim 11, wherein the at least one loop includes a low pass filter.

14. The structure of claim 13, wherein the low pass filter comprises at least one capacitor and a corner frequency of the low pass filter is programmable by changing the capacitance of the at least one capacitor.

15. The structure of claim 13, wherein the corner frequency is set to more than about three times a highest modulation bandwidth.

16. The structure of claim 15, wherein the plurality of transistors offer protection from the drain to gate over stress by adjusting a gate voltage of the plurality of transistors through a cascode voltage.

17. The structure of claim 16, wherein a back-gate bias is changed from the cascode voltage to provide the protection from the drain to gate over stress.

18. The structure of claim 17, wherein the drain to gate over stress is from a voltage standing wave ratio.

19. A method, comprising:
- protecting a pseudo-differential common source amplifier from an over stress through first stage cascode devices connected to the pseudo-differential common source amplifier;
- providing differential outputs from second stage cascode devices connected to the first stage cascode devices; and
- feeding back through at least one loop the differential outputs to the second stage cascode devices, wherein
- the second stage cascode devices comprise a plurality of transistors and the at least one loop feeding back the differential outputs to the plurality of transistors,
- gates of the plurality of transistors connect the differential outputs for reducing a drain to gate over stress, and
- the at least one loop comprises a diode-connected transistor for boosting signals at the gates of the transistors.

20. The method of claim 19, further comprising converting the differential outputs into a single-ended output through a transformer connected to the second stage cascode devices.

\* \* \* \* \*